(12) United States Patent
Kim

(10) Patent No.: US 10,608,359 B2
(45) Date of Patent: Mar. 31, 2020

(54) CONNECTION STRUCTURE BETWEEN FLAT CABLE AND ELECTRONIC CIRCUIT BOARD

(71) Applicant: SAMSUNG ELECTRONICS CO., LTD., Suwon-si (KR)

(72) Inventor: Sung-soo Kim, Suwon-si (KR)

(73) Assignee: SAMSUNG ELECTRONICS CO., LTD., Suwon-si (KE)

(*) Notice: Subject to any disclaimer, the term of this patent is extended or adjusted under 35 U.S.C. 154(b) by 0 days.

(21) Appl. No.: 15/843,066

(22) Filed: Dec. 15, 2017

(65) Prior Publication Data

US 2018/0175531 A1    Jun. 21, 2018

Related U.S. Application Data

(60) Provisional application No. 62/436,541, filed on Dec. 20, 2016, provisional application No. 62/435,161, filed on Dec. 16, 2016.

(30) Foreign Application Priority Data

Apr. 18, 2017    (KR) .................. 10-2017-0049886

(51) Int. Cl.
*H01R 12/79*    (2011.01)
*H01R 12/70*    (2011.01)
(Continued)

(52) U.S. Cl.
CPC ......... *H01R 12/79* (2013.01); *H01R 12/7023* (2013.01); *H01R 12/718* (2013.01);
(Continued)

(58) Field of Classification Search
CPC ............. H05K 2201/048; H05K 3/366; H05K 2201/09645; H05K 2201/09172;
(Continued)

(56) References Cited

U.S. PATENT DOCUMENTS 4,109,298 A * 8/1978 Hanni .................... H05K 3/326
174/261
4,705,482 A * 11/1987 Endo ...................... H01R 12/79
439/460

(Continued)

FOREIGN PATENT DOCUMENTS

EP    1056319 A2 * 11/2000 ............. H05K 3/366
JP    8-203577 A    8/1996
(Continued)

OTHER PUBLICATIONS

English Translation of EP-1056319-A2, Rusnak Reinhold, Nov. 2000 (Year: 2000).*

*Primary Examiner* — Edwin A. Leon
*Assistant Examiner* — Matthew T Dzierzynski
(74) *Attorney, Agent, or Firm* — Sughrue Mion, PLLC

(57) ABSTRACT

A connection structure between a flat cable and an electronic circuit board includes an electronic circuit board; a cable connection hole formed to penetrate the electronic circuit board; a plurality of internal contacts provided on an inner surface of the cable connection hole; and a flat cable provided with a plurality of contacts which correspond to the plurality of internal contacts of the cable connection hole and are exposed to one side surface of the flat cable. When one end of the flat cable is inserted into the cable connection hole of the electronic circuit board, the plurality of contacts of the flat cable are in contact with the plurality of internal contacts of the cable connection hole, respectively.

14 Claims, 20 Drawing Sheets

(51) Int. Cl.
　　　*H01R 12/71* (2011.01)
　　　*H01R 12/77* (2011.01)
　　　*H01R 12/88* (2011.01)
　　　*H05K 1/18* (2006.01)

(52) U.S. Cl.
　　CPC ........... *H01R 12/778* (2013.01); *H05K 1/184* (2013.01); *H01R 12/88* (2013.01); *H05K 2201/09181* (2013.01); *H05K 2201/09645* (2013.01); *H05K 2201/10189* (2013.01); *H05K 2201/10356* (2013.01)

(58) Field of Classification Search
　　CPC .......... H05K 2201/09181; H05K 2201/09036; H05K 2201/09063; H05K 2201/09854; H05K 2201/10356; H05K 3/36; H05K 3/403; H05K 1/111; H05K 1/116; H05K 1/184; H01R 12/52; H01R 12/53; H01R 12/62; H01R 12/718; H01R 12/79; H01R 12/7023; H01R 12/772; H01R 12/778; H01R 12/88; H01R 13/631; H01R 43/0256; H01R 43/0263
　　See application file for complete search history.

(56) References Cited

U.S. PATENT DOCUMENTS

| | | | | |
|---|---|---|---|---|
| 4,778,403 | A * | 10/1988 | Ikesugi | H01R 23/668 439/329 |
| 4,886,942 | A * | 12/1989 | Lenz | H01R 12/772 174/135 |
| 4,955,814 | A * | 9/1990 | Christie | H01R 12/53 439/449 |
| 5,173,058 | A * | 12/1992 | Broeksteeg | H01R 13/193 439/267 |
| 5,186,651 | A * | 2/1993 | Fuchs | H01R 12/777 439/326 |
| 5,206,462 | A * | 4/1993 | Iura | H01R 43/0228 174/117 A |
| 5,212,348 | A * | 5/1993 | Gibson | H01R 43/28 174/117 F |
| 5,344,338 | A * | 9/1994 | Colleran | H01R 12/772 174/135 |
| 5,354,214 | A * | 10/1994 | Aso | H01R 12/79 439/492 |
| 5,455,742 | A * | 10/1995 | Phoy | H05K 3/366 174/250 |
| 5,462,451 | A * | 10/1995 | Yeh | H01R 12/7023 439/493 |
| 5,484,965 | A * | 1/1996 | Woychik | H05K 3/3452 174/260 |
| 5,777,855 | A * | 7/1998 | Yokajty | H01R 12/62 361/749 |
| 5,924,891 | A * | 7/1999 | Benjamin | H01R 12/7005 439/495 |
| 6,326,549 | B1 * | 12/2001 | Kunii | H01R 43/28 174/117 F |
| 6,399,899 | B1 * | 6/2002 | Ohkawa | H01R 13/58 174/255 |
| 6,454,596 | B1 * | 9/2002 | Montagano | H01R 13/5804 439/460 |
| 6,496,384 | B1 * | 12/2002 | Morales | H05K 3/366 29/830 |
| 6,841,737 | B2 * | 1/2005 | Komatsubara | G11B 5/4853 174/250 |
| 7,147,480 | B2 * | 12/2006 | Ikeda | H05K 3/363 439/67 |
| 7,273,379 | B2 * | 9/2007 | Jang | H05K 3/366 361/803 |
| 7,649,144 | B2 * | 1/2010 | Honjo | H05K 3/363 174/254 |
| 7,652,890 | B2 * | 1/2010 | Ohsawa | G11B 5/486 174/254 |
| 7,804,695 | B2 * | 9/2010 | Thevenard | H01Q 1/38 361/803 |
| 7,872,200 | B2 * | 1/2011 | Yokai | H01R 12/592 174/254 |
| 8,678,844 | B2 * | 3/2014 | Yoshisuji | H01R 12/592 439/260 |
| 9,414,502 | B2 | 8/2016 | Wu et al. | |
| 9,974,184 | B2 * | 5/2018 | Hayashi | H05K 1/183 |
| 2003/0236006 | A1 * | 12/2003 | Yamashita | H01R 43/0256 439/65 |
| 2006/0042816 | A1 * | 3/2006 | Sakurai | H01R 13/6585 174/88 R |
| 2007/0178751 | A1 * | 8/2007 | Yamamoto | H01R 12/79 439/495 |
| 2011/0043954 | A1 | 2/2011 | Chuang et al. | |
| 2012/0055700 | A1 * | 3/2012 | Horiguchi | C09J 133/02 174/254 |
| 2012/0181060 | A1 * | 7/2012 | Chen | H05K 1/024 174/117 F |
| 2016/0050763 | A1 | 2/2016 | Yang et al. | |
| 2017/0020001 | A1 * | 1/2017 | Weidinger | H05K 1/183 |

FOREIGN PATENT DOCUMENTS

JP　　　　9-312455 A　　12/1997
JP　　　　4020050 B2　　12/2007

* cited by examiner

CONNECTION STRUCTURE BETWEEN FLAT CABLE AND ELECTRONIC CIRCUIT BOARD

CROSS-REFERENCE TO RELATED APPLICATIONS

This application claims the benefit of U.S. provisional applications No. 62/435,161, filed Dec. 16, 2016, and No. 62/436,541, filed Dec. 20, 2016, in the United States Patent & Trademark Office, and claims the benefit of Korean Patent Application No. 10-2017-0049886 filed Apr. 18, 2017, in the Korean Intellectual Property Office, the disclosure of both of which are incorporated herein by reference in their entirety.

BACKGROUND

1. Field

The present disclosure relates to a connection structure between a flat cable and an electronic circuit board. More particularly, the present disclosure relates to a connection structure between a flat cable and an electronic circuit board capable of vertically connecting a flat cable to an electronic circuit board on which a connector is not provided.

2. Description of the Related Art

Generally, an electronic circuit provided on an electronic circuit board may be electrically connected to another electronic circuit provided on another electronic circuit board or an electronic device through a flat cable.

A connector is provided on the electronic circuit board to connect the flat cable.

FIG. 1 illustrates a conventional connection structure between a flat cable and an electronic circuit board.

Referring to FIG. 1, a connector 110 is disposed on an electronic circuit board 100, and a flat cable 120 is fixed to the connector 110. At this time, the flat cable 120 is fixed to the connector 110 in a state substantially parallel to the electronic circuit board 100.

In order to fix the flat cable 120 to the connector 110 on the electronic circuit board 100, first, a fixing cover 112 of the connector 110 is opened to open a connecting portion 114. Thereafter, one end of the flat cable 120 is inserted into the connecting portion 114 of the connector 110 in a direction substantially parallel to the electronic circuit board 100, and then the fixing cover 112 is closed, so that the flat cable 120 is fixed to the connector 110 on the electronic circuit board 100.

However, because the conventional connection structure between the flat cable 120 and the electronic circuit board 100 requires that the fixing cover 112 of the connector 110 is opened and closed and the flat cable 120 is inserted into the connector 110 substantially parallel to the electronic circuit board 100, it is difficult to automate the conventional connection structure.

In addition, because the structure of an automation equipment for opening and closing the fixing cover 112 of the connector 110 provided on the electronic circuit board 100 and moving the flat cable 120 substantially parallel to the electronic circuit board 100 is complex, the manufacturing cost of the automation equipment itself becomes expensive.

Therefore, it is difficult to reduce the assembly cost of the electronic circuit board using the conventional connection structure between the flat cable and the electronic circuit board.

SUMMARY

The present disclosure has been developed in order to overcome the above drawbacks and other problems associated with the conventional arrangement. An aspect of the present disclosure relates to a connection structure between a flat cable and an electronic circuit board in which since a connector provided on an electronic circuit board is removed, the work of connecting a flat cable to the electronic circuit board can be easily automated, cost of an automatic equipment itself can be reduced, and an assembly cost of the electronic circuit board can be reduced.

According to an aspect of the present disclosure, a connection structure between a flat cable and an electronic circuit board may include an electronic circuit board; a cable connection hole formed to penetrate the electronic circuit board; a plurality of internal contacts provided on an inner surface of the cable connection hole; and a flat cable provided with a plurality of contacts which correspond to the plurality of internal contacts of the cable connection hole and are exposed to one side surface of the flat cable, wherein when one end of the flat cable is inserted into the cable connection hole of the electronic circuit board, the plurality of contacts of the flat cable are in contact with the plurality of internal contacts of the cable connection hole, respectively.

Each of the plurality of internal contacts may include a contact groove which is formed in the inner surface of the cable connection hole and includes a semicircular cross-section; and a conductive layer which is formed on an inner surface of the contact groove at a predetermined height and includes electrical conductivity.

Each of the plurality of internal contacts may include a filling member which is filled on the conductive layer at a level equal to the inner surface of the cable connection hole and includes electrical conductivity.

Each of the plurality of internal contacts may include a plating layer formed of an electrically conductive material on a surface of the filling member exposed to the inner surface of the cable connection hole.

The plurality of internal contacts may be perpendicular to or inclined with respect to one surface of the electronic circuit board on which the cable connection hole is formed.

The flat cable may include a base portion; a cover portion; a plurality of conductive lines provided between the base portion and the cover portion; a connection opening formed in the cover portion and spaced apart from one end of the cover portion, wherein a part of each of the plurality of conductive lines is exposed through the connection opening; and a support portion provided on the base portion opposite to the cover portion at a position corresponding to the connection opening, wherein the part of each of the plurality of conductive lines exposed through the connection opening may form each of the plurality of contacts.

The one end of the flat cable may be provided with a tapered insertion structure, and a pair of fixing grooves may be provided adjacent to both sides of the connection opening of the flat cable.

The flat cable may include a housing provided in the plurality of contacts. When the housing is inserted into the cable connection hole, the plurality of contacts of the flat cable may be electrically connected to the plurality of internal contacts of the cable connection hole, respectively.

The housing may include a housing body formed in a shape corresponding to the cable connection hole and fixing the flat cable; and a plurality of terminals corresponding to the plurality of contacts of the flat cable and including a plurality of housing contacts exposed to one side of the housing body, and wherein when the housing is inserted into the cable connection hole, the housing contacts may be in contact with the internal contacts of the cable connection hole, respectively.

Other objects, advantages and salient features of the present disclosure will become apparent from the following detailed description, which, taken in conjunction with the annexed drawings, discloses exemplary embodiments.

BRIEF DESCRIPTION OF THE DRAWINGS

These and/or other aspects and advantages of the present disclosure will become apparent and more readily appreciated from the following description of the embodiments, taken in conjunction with the accompanying drawings of which.

Throughout the drawings, like reference numerals will be understood to refer to like parts, components and structures.

DETAILED DESCRIPTION OF THE EXEMPLARY EMBODIMENTS

Hereinafter, certain exemplary embodiments of the present disclosure will be described in detail with reference to the accompanying drawings.

The matters defined herein, such as a detailed construction and elements thereof, are provided to assist in a comprehensive understanding of this description. Thus, it is apparent that exemplary embodiments may be carried out without those defined matters. Also, well-known functions or constructions are omitted to provide a clear and concise description of exemplary embodiments. Further, dimensions of various elements in the accompanying drawings may be arbitrarily increased or decreased for assisting in a comprehensive understanding.

The terms "first", "second", etc. may be used to describe diverse components, but the components are not limited by the terms. The terms are only used to distinguish one component from the others.

The terms used in the present application are only used to describe the exemplary embodiments, but are not intended to limit the scope of the disclosure. The singular expression also includes the plural meaning as long as it does not differently mean in the context. In the present application, the terms "include" and "consist of" designate the presence of features, numbers, steps, operations, components, elements, or a combination thereof that are written in the specification, but do not exclude the presence or possibility of addition of one or more other features, numbers, steps, operations, components, elements, or a combination thereof.

Figure 1:
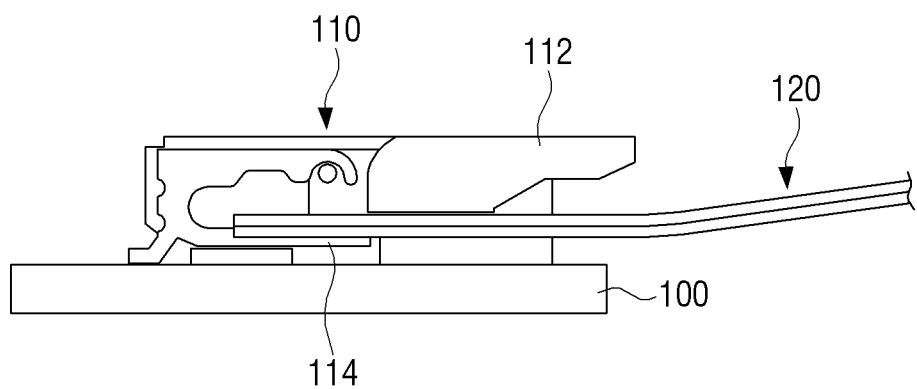
FIG. 1 is a view illustrating a conventional connection structure between a flat cable and an electronic circuit board.
Figure 2:
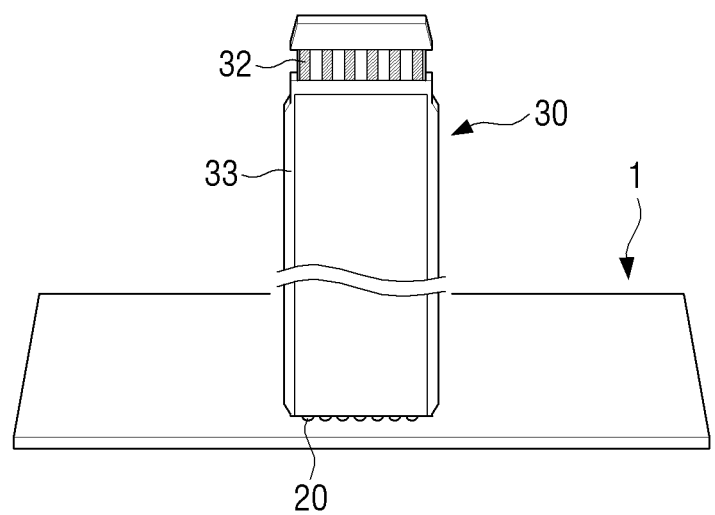
FIG. 2 is a view illustrating a connection structure between a flat cable and an electronic circuit board according to an exemplary embodiment of the present disclosure.
Figure 3:
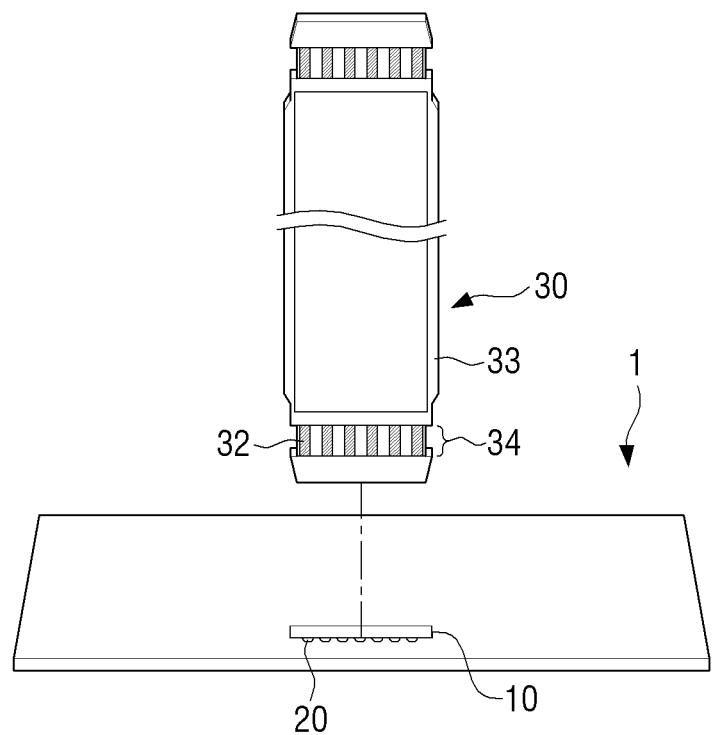
FIG. 3 is a perspective view illustrating a state in which the flat cable is separated from the electronic circuit board of FIG. 2.
Figure 4:
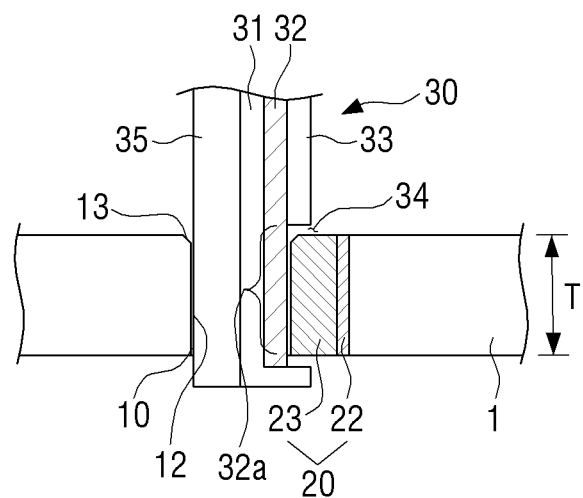
FIG. 4 is a cross-sectional view illustrating a connection structure between a flat cable and an electronic circuit board according to an exemplary embodiment of the present disclosure.
Figure 5:
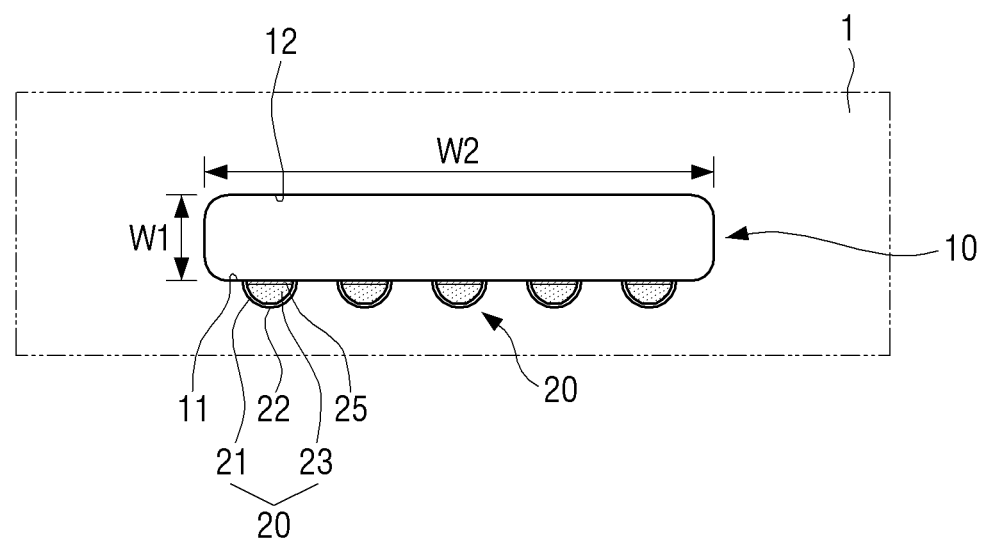
FIG. 5 is a plan view illustrating a cable connection hole of an electronic circuit board according to an exemplary embodiment of the present disclosure.
Figure 6:
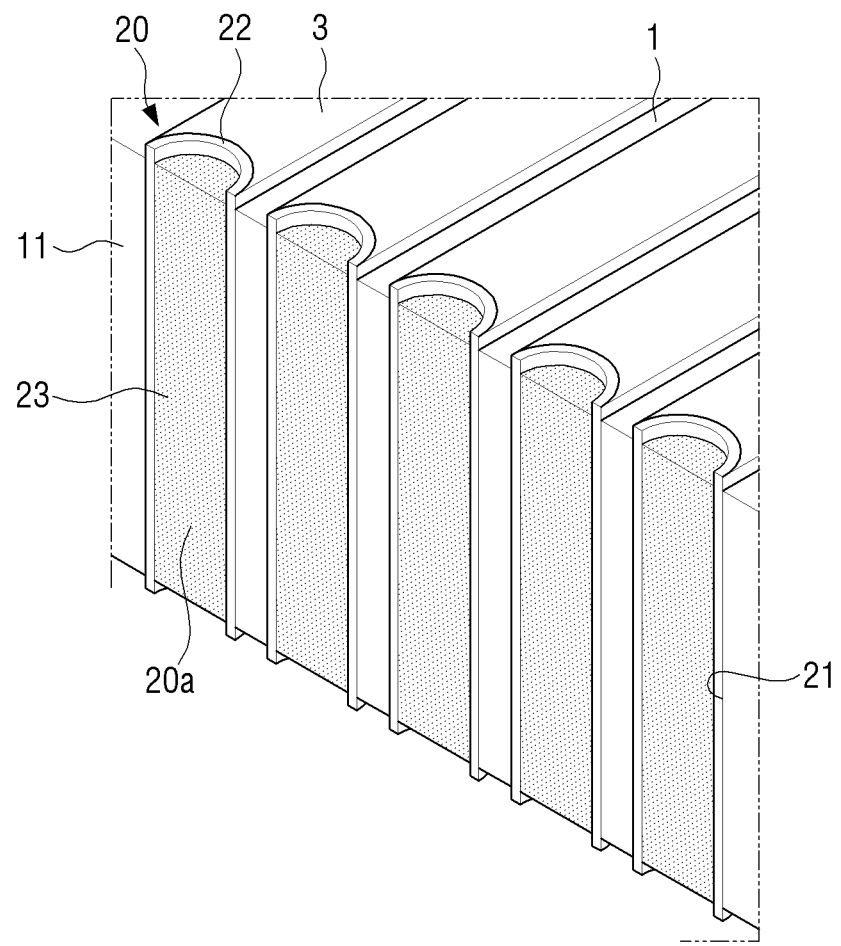
FIG. 6 is a partial perspective view illustrating a plurality of internal contacts of the cable connection hole of FIG. 5.

FIG. 2 is a view illustrating a connection structure between a flat cable and an electronic circuit board according to an exemplary embodiment of the present disclosure, and FIG. 3 is a perspective view illustrating a state in which the flat cable is separated from the electronic circuit board of FIG. 2. FIG. 4 is a cross-sectional view illustrating a connection structure between a flat cable and an electronic circuit board according to an exemplary embodiment of the present disclosure. FIG. 5 is a plan view illustrating a cable connection hole of an electronic circuit board according to an exemplary embodiment of the present disclosure, and FIG. 6 is a partial perspective view illustrating a plurality of internal contacts of the cable connection hole of FIG. 5.

Referring to FIGS. 2 to 6, a connection structure between a flat cable and an electronic circuit board according to an exemplary embodiment of the present disclosure may include an electronic circuit board 1 provided with a cable connection hole 10 and a flat cable 30 whose one end is inserted into the cable connection hole 10.

The electronic circuit board 1 is provided with electronic components such as resistors, condensers, memories, microprocessors, and the like which constitute an electronic circuit capable of performing a predetermined function. The electronic circuit board 1 is provided with the cable connection hole 10 through which the flat cable 30 for connecting with another electronic circuit board or another electronic device may be disposed.

The cable connection hole 10 is formed to penetrate the electronic circuit board 1. For example, the cable connection hole 10 is formed to penetrate from the top surface to the bottom surface of the electronic circuit board 1. The cable connection hole 10 is formed in a substantially rectangular shape. A plurality of internal contacts 20 connected to a pattern 3 of the electronic circuit are provided on the inner surface 11 of the cable connection hole 10. The plurality of internal contacts 20 are formed perpendicular to one surface of the electronic circuit board 1 on which the cable connection hole 10 is formed. For example, as illustrated in FIG. 6, the internal contacts 20 are formed on the inner surface 11 of the cable connection hole 10 at right angles to the top surface of the electronic circuit board 1. The inner surface 11 of the cable connection hole 10 in which the plurality of internal contacts 20 are formed will be hereinafter be referred to as a contact surface 11 of the cable connection hole 10.

Referring to FIGS. 5 and 6, each of the plurality of internal contacts 20 may include a contact groove 21 and a conductive layer 22.

The contact groove 21 may be formed in a semicircular cross-sectional shape on the inner surface 11 of the cable connection hole 10. Also, the conductive layer 22 may be formed on the inner surface of the contact groove 21 at a predetermined height and may be made of a material having electrical conductivity. Accordingly, the conductive layer 22 is formed in the shape of a pipe having a semicircular cross-section provided in the contact groove 21.

In addition, the conductive layer 22 may be provided with a filling member 23 having electrical conductivity. For example, the filling member 23 may be filled with the same level as the inner surface 11 of the cable connection hole 10 in which the plurality of contact grooves 21 are formed. Accordingly, when the filling member 23 is provided on the conductive layer 22, the surface of the filling member 23 forms the same plane as the inner surface 11 of the cable connection hole 10.

The circumference of the inlet 13 of the cable connection hole 10 may be rounded or chamfered so that one end of the flat cable 30 can be smoothly inserted into the cable connection hole 10. FIG. 4 shows an example in which the inlet 13 of the cable connection hole 10 is chamfered.

In addition, a plating layer 25 may be formed on the contact surface of the internal contact 20 of the cable connection hole 10 so that when the one end of the flat cable 30 is inserted into the cable connection hole 10, stable conductivity is performed between the contact of the flat cable 30 and the internal contact 20 of the cable connection hole 10. For example, the plating layer 25 may be formed of an electrically conductive material on both end surfaces of the conductive layer 22 exposed to the inner surface 11 of the cable connection hole 10 and on the surface of the filling member 23. At this time, the plating layer 25 may be formed of an electrically conductive material such as solder, copper (Cu), gold (Au), and silver (Ag), or the like.

The plurality of internal contacts 20 of the cable connection hole 10 as described above may be formed using a general via-hole processing method of an electronic circuit board.

For example, the plurality of internal contacts 20 may be provided by forming a plurality of via holes in the electronic circuit board 1 and forming the cable connection hole 10 to penetrate the electronic circuit board 1 so that a plane passing through the centers of the plurality of via holes is the inner surface 11 of the cable connection hole 10.

In detail, first, a plurality of via holes are formed in a portion of the electronic circuit board 1 to which the flat cable 30 is to be coupled at an interval corresponding to a plurality of conductive lines 32 of the flat cable 30. At this time, the inside of each of the plurality of via holes may not be filled or may be filled. Next, the plurality of via holes are cut in the longitudinal direction to form the cable connection hole 10 penetrating the electronic circuit board 1. When one surface 11 of the cable connection hole 10 is machined to coincide with a plane passing through the centers of the plurality of via holes, the contact area of each of the internal contacts 20 may be maximally obtained. At this time, each of the cut via holes forms the conductive layer 22.

Figure 7:
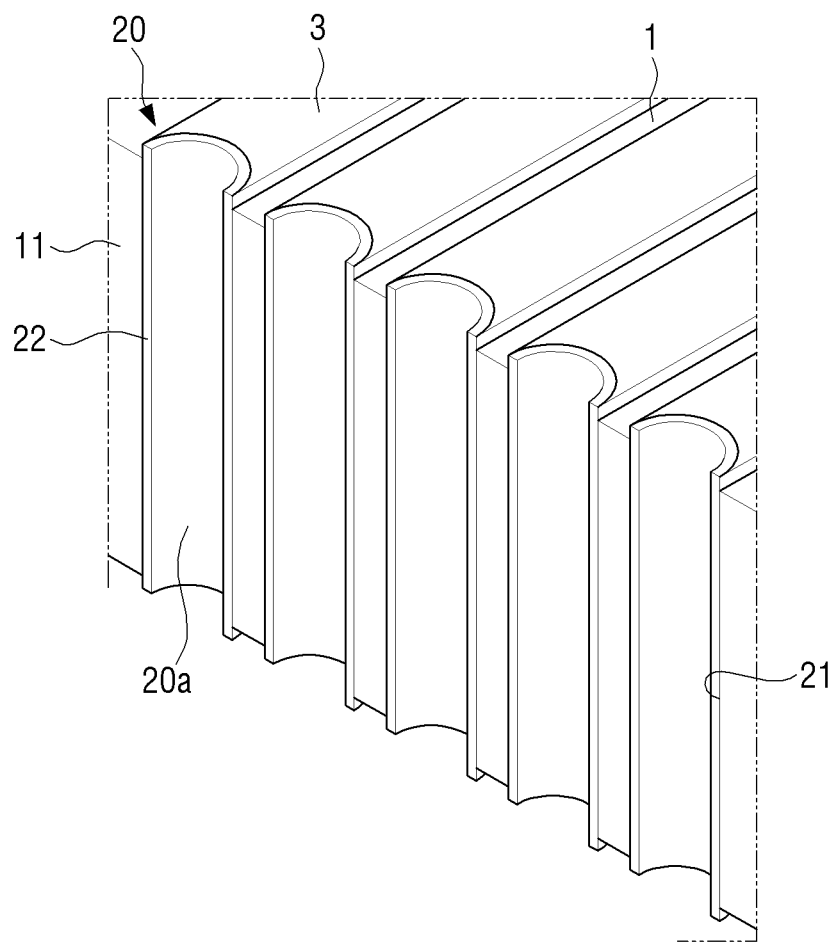
FIG. 7 is a partial perspective view illustrating another example of a plurality of internal contacts of a cable connection hole formed in an electronic circuit board.

When the plurality of via holes are filled and then the plurality of via holes are cut, as illustrated in FIG. 6, the surface 20a of each of the plurality of internal contacts 20 is formed in a rectangular shape. At this time, the material filling the inside of the via hole forms the filling member 23. However, in the case of cutting the plurality of via holes without filling the inside of the plurality of via holes, as illustrated in FIG. 7, the surface 20a of each of the plurality of internal contacts 20 is formed in a curved surface shape corresponding to a semicircle.

When filling the inside of the plurality of via holes, that is, when filling the filling member 23 on the surfaces of the conductive layers 22 of the via holes as illustrated in FIG. 6, after the via-holes are formed, the via holes are formed and then the via holes may be filled with a conductive metal by various methods. For example, the via hole may be filled with the conductive metal by spray coating, painting, immersion in a metal solution, direct injection method, or the like.

In the above description, the cable connection hole 10 is formed perpendicular to the top surface of the electronic circuit board 1. However, as another example, the cable connection hole may be formed to be inclined with respect to the top surface of the electronic circuit board 1.

Figure 8:
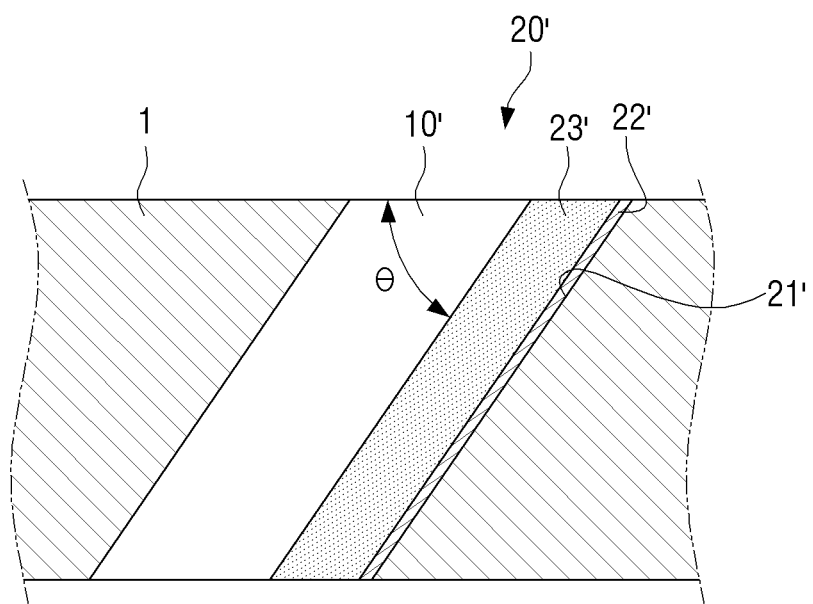
FIG. 8 is a partial cross-sectional view illustrating a case where a cable connection hole is formed obliquely in an electronic circuit board.

FIG. 8 is a partial cross-sectional view illustrating a case where a cable connection hole is formed in an inclined manner in an electronic circuit board.

Referring to FIG. 8, the cable connection hole 10' is formed to be inclined at a predetermined angle θ with respect to the top surface of the electronic circuit board 1. For example, the cable connection hole 10' may be formed to be inclined at about 15 degrees with respect to the top surface of the electronic circuit board 1. However, the inclination angle θ of the cable connection hole 10' is not limited thereto, and may be appropriately determined as necessary. At this time, a plurality of internal contacts 20' provided on the inner surface of the cable connection hole 10' are formed to be inclined at the same angle θ as the cable connection hole 10' with respect to the top surface of the electronic circuit board 1. Each of the plurality of internal contacts 20' provided on the inner surface of the cable connection hole 10' may include a contact groove 21', a conductive layer 22', and a filling member 23' like the internal contacts 20 according to the above-described exemplary embodiment.

The plurality of internal contacts 20' provided in the cable connection hole 10' according to the present exemplary embodiment may be formed in the same structure as the plurality of internal contacts 20 of the cable connection hole 10 formed in the electronic circuit board 1 according to the above-described exemplary embodiment; therefore, the detailed description thereof is omitted.

As illustrated in FIG. 8, when the cable connection hole 10' and the plurality of internal contacts 20' are inclined with respect to the top surface of the electronic circuit board 1, the length of each of the internal contacts 20' becomes longer than when the cable connection hole 10 and the plurality of internal contacts 20 are formed perpendicular to the top surface of the electronic circuit board 1 as illustrated in FIG. 4. Accordingly, in the present exemplary embodiment, the contact area between the internal contacts 20' and the contacts of the flat cable 30 inserted into the cable connection hole 10' is increased.

Figure 9A:
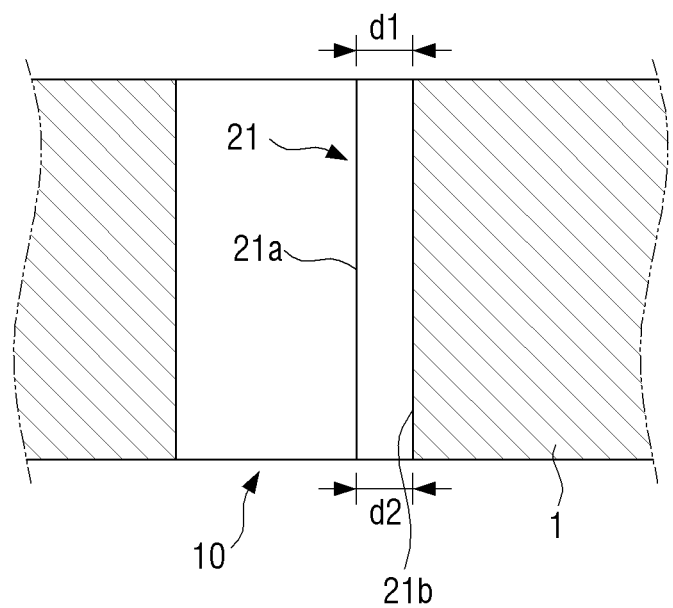
FIGS. 9A, 9B, and 9C are views illustrating various examples of contact grooves forming a plurality of internal contacts of a cable connection hole formed in an electronic circuit board.
Figure 9B:
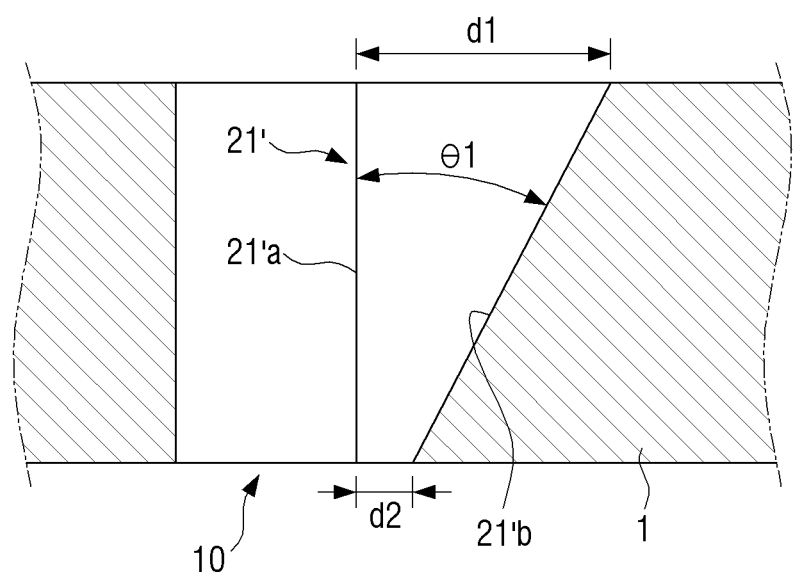
Figure 9C:
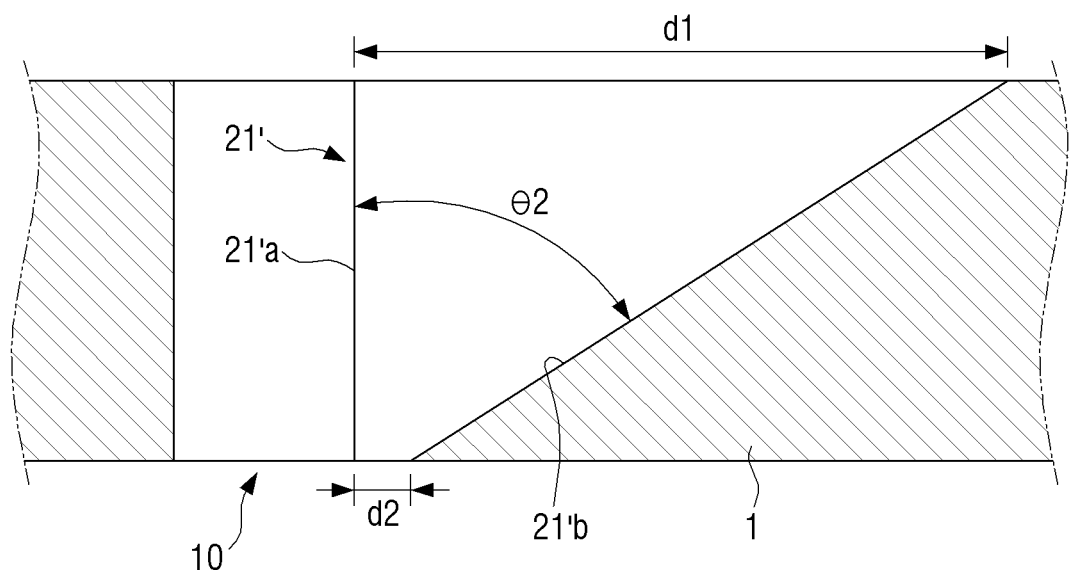

As another example, the rear surface of the contact groove of each of the plurality of internal contacts 20 may be formed at various angles with respect to the inner surface of the cable connection hole 10 as illustrated in FIGS. 9A, 9B, and 9C.

FIGS. 9A, 9B, and 9C are views illustrating various examples of contact grooves forming a plurality of internal contacts of a cable connection hole formed in an electronic circuit board.

As illustrated in FIG. 9A, the contact groove 21 may be formed perpendicular to the top surface of the electronic circuit board 1. In other words, the front surface 21a of the contact groove 21 exposed to the inner surface of the cable connection hole 10 and the rear surface 21b of the contact groove 21 facing the front surface 21a of the contact groove 21 may be formed to be parallel to each other. At this time, the width d1 of one end of the contact groove 21 and the width d2 of the other end of the contact groove 21 are the same (d1=d2). Accordingly, the internal contacts 20 formed by the contact grooves 21 are formed so that the front surface 20a (see FIG. 6) of the internal contact 20 exposed to the inner surface 11 of the cable connection hole 10 is parallel to the rear surface of the internal contact 20 facing the front surface 20a of the internal contact 20.

Alternatively, as illustrated in FIGS. 9B and 9C, the contact groove 21' may be formed to be inclined with respect to the top surface of the electronic circuit board 1. For example, the front surface 21'a of the contact groove 21' exposed to the inner surface of the cable connection hole 10 is formed to be perpendicular to the top surface of the electronic circuit board 1, and the rear surface 21'b of the contact groove 21' facing the front surface 21'a of the contact groove 21' is formed to be inclined at a predetermined angle with respect to the top surface of the electronic circuit board 1. In other words, the contact groove 21' may be formed in a substantially right-angled trapezoidal shape as illustrated in FIGS. 9B and 9C. Therefore, the width d1 of one end of the contact groove 21' is larger than the width d2 of the other end of the contact groove 21'. FIG. 9B illustrates a case where the rear surface 21'b of the contact groove 21' is inclined at about 15 degrees (θ1) with respect to the front surface 21'a of the contact groove 21', that is, the inner surface 11 of the cable connection hole 10. FIG. 9C illustrates a case where the rear surface 21'b is inclined at about 45 degrees (θ2) with respect to the inner surface 11 of the cable connection hole 10.

When the contact groove 21' is formed in a right angle trapezoidal shape as described above, the internal contact formed by the contact groove 21' is also formed in a right angle trapezoidal shape so that the front surface of the contact, which is exposed to the inner surface 11 of the cable connection hole 10, is perpendicular to the top surface of the electronic circuit board 1 and the rear surface of the contact, which faces the front surface of the contact, is inclined at a predetermined angle with respect to the top surface of the electronic circuit board 1. As illustrated in FIGS. 9B and 9C, when the contact groove 21' is formed in a right angle trapezoidal shape, the connection between the electronic circuit board 1 and the internal contacts 20 may be strengthened.

In FIGS. 9B and 9C, the rear surface 21'b of the contact groove 21' is inclined at about 15 degrees and about 45 degrees with respect to the inner surface 11 of the cable connection hole 10. However, the inclination of the rear surface 21'b of the contact groove 21' is not limited thereto. The inclination of the rear surface 21'b of the contact groove 21' may be arbitrarily determined within a range of 0 to 60 degrees as necessary.

The flat cable 30 is formed to be inserted into the cable connection hole 10 of the electronic circuit board 1, and includes a plurality of contacts 32a which are exposed through one side of the flat cable 30 and correspond to the plurality of internal contacts 20 of the cable connection hole 10.

Hereinafter, the flat cable to be used in a connection structure of a flat cable and an electronic circuit board according to an exemplary embodiment of the present disclosure will be described with reference to FIGS. 10 to 12.

Figure 10:
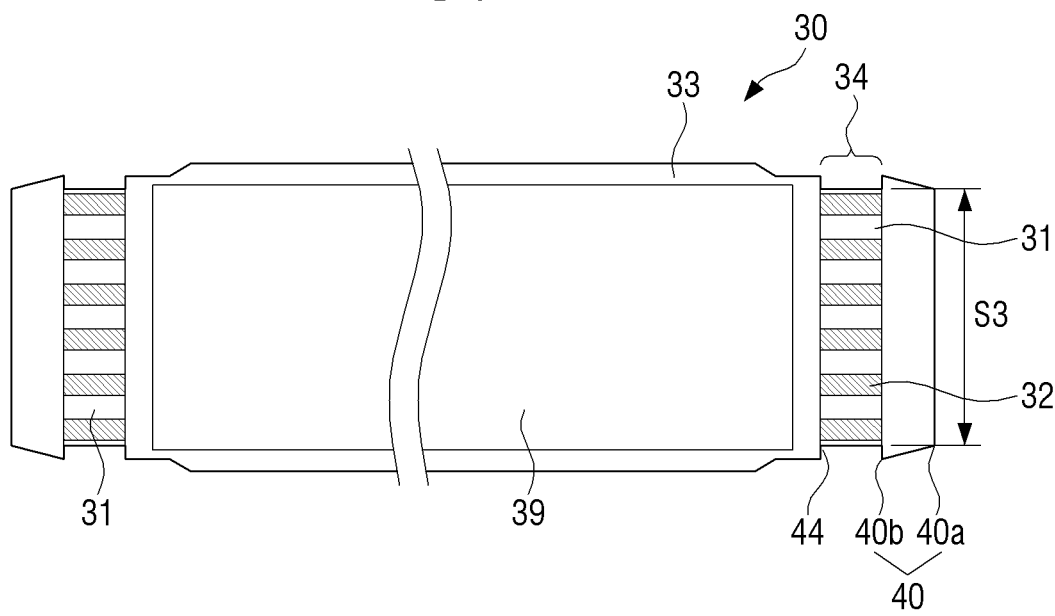
FIG. 10 is a plan view illustrating a flat cable according to an exemplary embodiment of the present disclosure.
Figure 11:
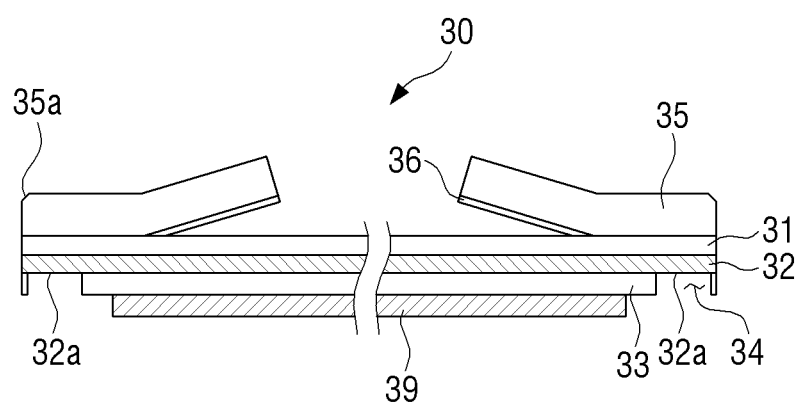
FIG. 11 is a cross-sectional view illustrating the flat cable of FIG. 10.

FIG. 10 is a plan view illustrating a flat cable according to an exemplary embodiment of the present disclosure, and FIG. 11 is a cross-sectional view illustrating the flat cable of FIG. 10. FIG. 12 is a partial cross-sectional view illustrating an insertion structure and a fixing structure of a flat cable according to an exemplary embodiment of the present disclosure.

Figure 12:
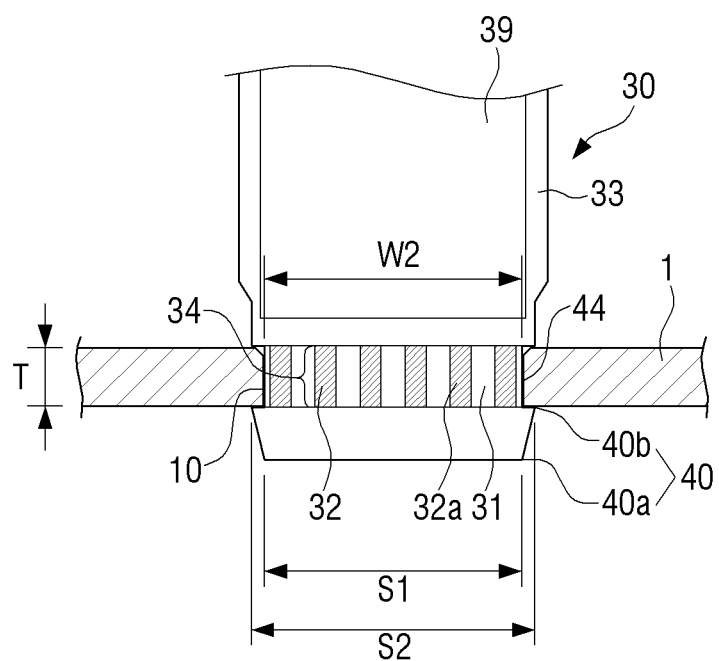
FIG. 12 is a partial cross-sectional view illustrating an insertion structure and a fixing structure of a flat cable according to an exemplary embodiment of the present disclosure.

Referring to FIGS. 10 to 12, the flat cable 30 may include a base portion 31, a plurality of conductive lines 32, a cover portion 33, and a support portion 35.

The base portion 31 supports the plurality of conductive lines 32 and is formed in a substantially rectangular shape. The base portion 31 may be formed of an insulating material. For example, the base portion 31 may be formed of polyethylene terephthalate. The length of the base portion 31 may be determined based on the distance between two electronic circuit boards to be connected or the distance between the electronic circuit board and an electronic device.

The plurality of conductive lines 32 allow electric current to flow and may be made of an electrically conductive material. For example, the plurality of conductive lines 32 may be formed of copper. The plurality of conductive lines 32 may be provided in parallel on one surface of the base portion 31 and may have the same length as the base portion 31.

The cover portion 33 is provided on the base portion 31 and covers the plurality of conductive lines 32. The cover portion 33 may be formed in a substantially rectangular shape corresponding to the base portion 31 and may be formed of the same insulating material as the base portion 31. For example, the cover portion 33 may be formed of polyethylene terephthalate. The cover portion 33 may be formed to have a length corresponding to the base portion 31 to cover the whole of the plurality of conductive lines 32.

The base portion 31, the plurality of conductive lines 32, and the cover portion 33 may be bonded with a flame retardant polyester adhesive.

A connection opening 34 through which a part of each of the plurality of conductive lines 32 is exposed is formed in the vicinity of one end of the cover portion 33. The connection opening 34 is formed to have a size corresponding to the contact surface 11 of the cable connection hole 10 of the electronic circuit board 1. For example, as illustrated in FIG. 4, when the flat cable 30 is inserted into the cable connection hole 10 of the electronic circuit board 1, the contact surface 11 of the cable connection hole 10 is located in the connection opening 34 of the flat cable 30. Accordingly, the connection opening 34 may be formed in such a shape that the cover portion 33 is cut to a length longer than the thickness T of the electronic circuit board 1.

Therefore, the connection opening 34 is formed at a position spaced apart from the one end of the flat cable 30 by a predetermined distance. The parts of the plurality of conductive lines 32 exposed through the connection opening 34 provided in the cover portion 33 form the plurality of contacts 32a of the flat cable 30.

The support portion 35 is provided on the other surface of the base portion 31, that is, the surface opposite to the one surface of the base portion 31 on which the cover portion 33 is provided. The support portion 35 is provided at a position corresponding to the connection opening 34 formed in the cover portion 33. In other words, the support portion 35 is formed to face the connection opening 34 with the base portion 31 therebetween.

The support portion 35 is formed to have the same width as the base portion 31 and a length longer than the length of the connection opening 34. The support portion 35 may provide elasticity to the flat cable 30 so that when one end of the flat cable 30 is inserted into the cable connection hole 10 of the electronic circuit board 1, the plurality of contacts 32a of the flat cable 30 are brought into close contact with the plurality of internal contacts 20 of the cable connection hole 10. For example, when the one end of the flat cable 30 is inserted into the cable connection hole 10 of the electronic circuit board 1, as illustrated in FIG. 4, the plurality of internal contacts 20 of the cable connection hole 10 are positioned in the connection opening 34 of the flat cable 30 and are in contact with the parts 32a of the plurality of conductive lines 32 exposed through the connection opening 34. At this time, the base portion 31, the support portion 35, and the other inner surface 12 of the cable connection hole 10 are sequentially positioned behind the parts of the plurality of conductive lines 32. Accordingly, when the narrow width W1 of the cable connection hole 10 is formed to be smaller than the thickness of the flat cable 30, the plurality of conductive lines 32 of the flat cable 30 are brought into close contact with the internal contacts 20 of the cable connection hole 10, that is, the filling member 23 by the elasticity of the support portion 35.

Accordingly, the thickness of the support portion 35 may be formed to be approximately twice or more as thick as the thickness of the base portion 31 or the cover portion 33. For example, when the thickness of the base portion 31 is 0.05 mm and the thickness of the cover portion 33 is 0.037 mm, the thickness of the support portion 35 may be 0.233 mm. Further, the thickness of the flat cable 30 is formed to be larger than the narrow width W1 of the cable connection hole 10. At this time, the thickness of the flat cable 30 and the narrow width W1 of the cable connection hole 10 may be determined so that one end of the flat cable 30 is smoothly inserted into the cable connection hole 10 and the plurality of contacts 32a of the flat cable 30 receives a sufficient contact force.

The support portion 35 may be formed of an elastic material. For example, the support portion 35 may be formed of the same material as the base portion 31, that is, polyethylene terephthalate. The support portion 35 may be adhered to the rear surface of the base portion 31 with a polyester adhesive. Alternatively, the support portion 35 may be formed in a tape form.

At this time, a part of the support portion 35 may be provided to be separated from the base portion 31. The part of the support portion 35 separated from the base portion 31 may serve as a handle when the flat cable 30 is removed from the cable connection hole 10 of the electronic circuit board 1. When the support portion 35 is formed in the tape form, a silicon tape 36 may be attached to the part of the support portion 35 which is separated from the base portion 31. When the silicon tape 36 is attached to the part of the support portion 35 as described above, it is possible to prevent the part of the support portion 35 from adhering to the rear surface of the base portion 31.

On the other hand, a conductive tape 39 may be provided on one surface of the cover portion 33. The conductive tape 39 may be formed in a rectangular shape smaller in size than the cover portion 33.

In addition, an edge 35a of one end of the support portion 35 corresponding to the one end of the flat cable 30 may be chamfered as illustrated in FIG. 11 so that the one end of the flat cable 30 is easily inserted into the cable connection hole 10 of the electronic circuit board 1.

An insertion structure 40 for facilitating the insertion of the flat cable 30 into the cable connection hole 10 of the electronic circuit board 1 and a fixing structure 44 for preventing the flat cable 30 from being easily detached from the cable connection hole 10 may be provided at one end of the flat cable 30.

As illustrated in FIGS. 10 and 12, the insertion structure 40 may be formed in a structure in which both side surfaces of one end of the flat cable 30 are tapered. At this time, the taper shape of the insertion structure 40 is formed to have a length protruding from the bottom surface of the electronic circuit board 1. In other words, when the one end of the flat cable 30 is coupled to the cable connection hole 10 of the electronic circuit board 1, the insertion structure 40 protrudes from the bottom surface of the electronic circuit board 1. The width S1 of a leading end 40a of the tapered insertion structure 40 may be formed to be narrower than the long width W2 of the cable connection hole 10 and the width S2 of the rear end 40b of the tapered insertion structure 40 may be formed to be wider than the long width W2 of the cable connection hole 10. Therefore, it is easy to insert the one end of the flat cable 30 having the tapered insertion structure 40 into the cable connection hole 10 of the electronic circuit board 1.

In addition, as illustrated in FIGS. 10 and 12, the fixing structure 44 may be formed as a pair of fixing grooves provided adjacent to the rear end 40b of the tapered insertion structure 40. The pair of fixing grooves 44 may be provided on both side surfaces of the flat cable 30 adjacent to the connection opening 34. The pair of fixing grooves 44 is formed in a size and shape such that the electronic circuit board 1 can be inserted. For example, the fixing structure 44 may be formed as a pair of fixing grooves formed at both side surfaces of the base portion 31 provided with the connection opening 34. At this time, the pair of fixing grooves 44 are spaced apart from a pair of conductive lines disposed outermost among the plurality of conductive lines 32, and the interval S3 between the pair of fixing grooves 44 is formed to be narrower than the long width W2 of the cable connection hole 10.

Therefore, when the one end of the flat cable 30 is inserted into the cable connection hole 10 of the electronic circuit board 1, the one end of the flat cable 30 may be easily inserted into the cable connection hole 10 by the tapered insertion structure 40. At this time, the width S2 of the rear end 40b of the tapered insertion structure 40 is larger than the long width W2 of the cable connection hole 10. However, since the flat cable 30 is elastic, the rear end 40b of the tapered insertion structure 40 can be passed through the cable connection hole 10 by applying a predetermined force.

Because the pair of fixing grooves constituting the fixing structure 44 is provided continuously to the rear end 40b of the tapered insertion structure 40, after the insertion structure 40 of the flat cable 30 is passed through the cable connection hole 10, the electronic circuit board 1 around the cable connection hole 10 is located in the pair of fixing grooves 44. Further, after the tapered insertion structure 40 of the flat cable 30 passes through the cable connection hole 10, the rear ends 40b of the tapered insertion structure 40 are returned to their original states by the elastic force. Since the width S2 of the rear ends 40b of the tapered insertion structure 40 is larger than the long width W2 of the cable connection hole 10, the rear ends 40b of the tapered insertion structure 40 are caught on the electronic circuit board 1. Therefore, once the one end of the flat cable 30 is inserted into the cable connection hole 10 of the electronic circuit board 1, the flat cable 30 is not easily detached from the cable connection hole 10.

Hereinafter, a connection structure between a flat cable and an electronic circuit board according to another exemplary embodiment of the present disclosure will be described in detail with reference to FIGS. 13 and 14.

Figure 13:
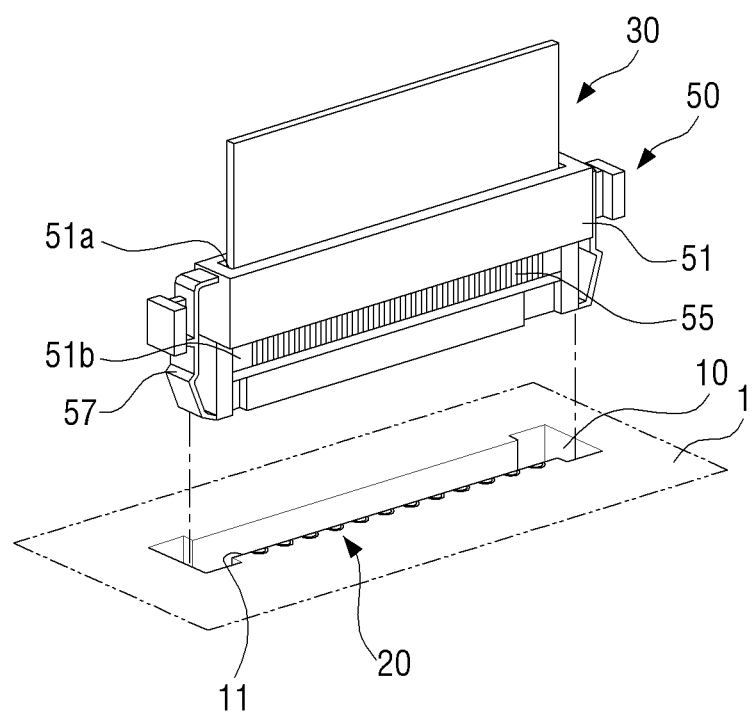
FIG. 13 is a perspective view illustrating a connection structure between a flat cable and an electronic circuit board according to another exemplary embodiment of the present disclosure.
Figure 14:
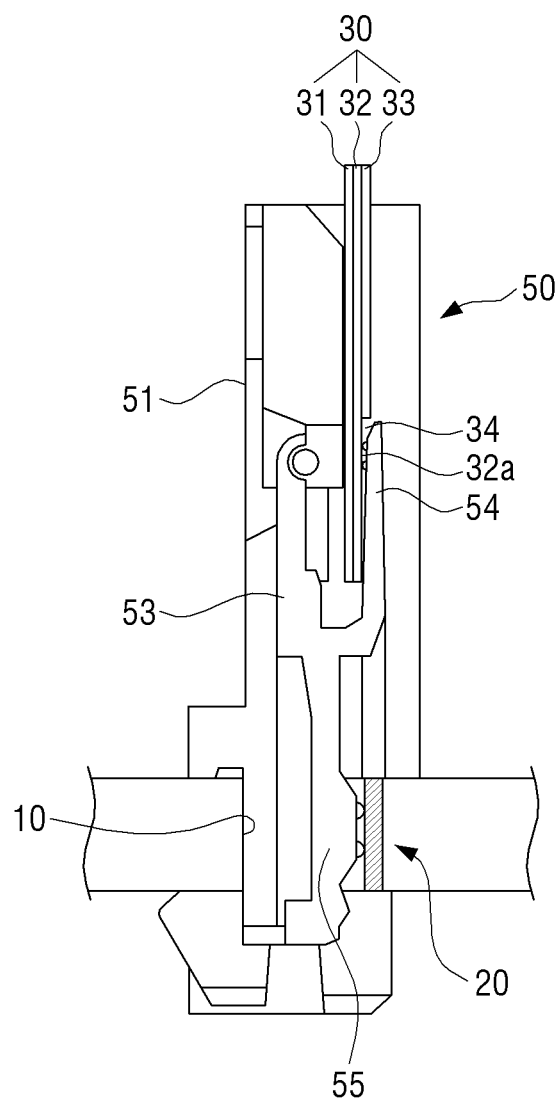
FIG. 14 is a partial cross-sectional view illustrating a state in which the flat cable and the electronic circuit board of FIG. 13 are connected.

FIG. 13 is a perspective view illustrating a connection structure between a flat cable and an electronic circuit board according to another exemplary embodiment of the present disclosure, and FIG. 14 is a partial cross-sectional view illustrating a state in which the flat cable and the electronic circuit board of FIG. 13 are connected.

Referring to FIGS. 13 and 14, a connection structure between a flat cable and an electronic circuit board according to an exemplary embodiment of the present disclosure may include an electronic circuit board 1 provided with a cable connection hole 10 and a flat cable 30 provided with a housing 50 which is inserted into the cable connection hole 10.

The electronic circuit board 1 is provided with various electronic components which constitute an electronic circuit capable of performing a predetermined function. The electronic circuit board 1 is provided with the cable connection hole 10 in which the flat cable 30 for connecting with another electronic circuit board or another electronic device may be disposed.

A plurality of internal contacts 20 are provided on the inner surface 11 of one side of the cable connection hole 10. The cable connection hole 10 formed in the electronic circuit board 1 is formed in a shape corresponding to the housing 50 so that the housing 50 can be inserted into the cable connection hole 10. The plurality of internal contacts 20 provided on the inner surface 11 of the cable connection hole 10 are the same as those of the above-described exemplary embodiment. Therefore, a detailed description thereof is omitted.

The flat cable 30 is inserted into the cable connection hole 10 of the electronic circuit board 1. The housing 50 is provided at a plurality of contacts 32a at one end of the flat cable 30.

The flat cable 30 may include a base portion 31, a plurality of conductive lines 32, and a cover portion 33.

The base portion 31 supports the plurality of conductive lines 32 and is formed in a substantially rectangular shape. The base portion 31 may be formed of an insulating material. For example, the base portion 31 may be formed of polyethylene terephthalate. The length of the base portion 31 may be determined based on the distance between two electronic circuit boards to be connected or the distance between the electronic circuit board and an electronic device to be connected.

The plurality of conductive lines 32 allow electric current to flow and may be made of an electrically conductive material. For example, the plurality of conductive lines 32 may be formed of copper. The plurality of conductive lines 32 may be provided in parallel on one surface of the base portion 31 and may be formed to have a length equal to or similar to that of the base portion 31.

The cover portion 33 is provided on the base portion 31 and covers the plurality of conductive lines 32. The cover portion 33 may be formed in a substantially rectangular shape corresponding to the base portion 31 and may be formed of the same insulating material as the base portion 31. For example, the cover portion 33 may be formed of polyethylene terephthalate. The cover portion 33 may be formed to have a length corresponding to the base portion 31 to cover the whole of the plurality of conductive lines 32.

The base portion 31, the plurality of conductive lines 32, and the cover portion 33 may be bonded with a flame retardant polyester adhesive.

A connection opening 34 through which parts of the plurality of conductive lines 32 are exposed is formed in the vicinity of one end of the cover portion 33. The connection opening 34 is formed to have a size corresponding to a connection contact 54 of the housing 50. For example, as illustrated in FIG. 14, when the housing 50 is provided at one end of the flat cable 30, the connection contact 54 of the housing 50 is in contact with the parts of the plurality of conductive lines 32 exposed through the connection opening 34. Accordingly, the connection opening 34 is formed at a predetermined distance from the one end of the flat cable 30, and the parts of the plurality of conductive lines 32 exposed through the connection opening 34 formed in the cover portion 33 form a plurality of contacts 32a of the flat cable 30.

The housing 50 is provided to be electrically connected to the plurality of contacts 32a through the connection opening 34 formed at the one end of the flat cable 30.

The housing 50 may include a housing body 51 and a plurality of terminals 53.

The housing body 51 is formed in a shape corresponding to the cable connection hole 10, so that the housing body 51 may be inserted into the cable connection hole 10 of the electronic circuit board 1. The housing body 51 fixes the plurality of terminals 53 therein. A cable connecting portion 51a to which the one end of the flat cable 30 is coupled is provided at one end of the housing body 51 and a contact portion 51b through which one ends of the plurality of terminals 53 are exposed is provided at the other end of the housing body 51. In addition, the housing body 51 is provided with a fixing portion 57 for fixing the housing body 51 to the electronic circuit board 1 so that the housing 50 is not detached from the cable connection hole 10 when the housing 50 is inserted into the cable connection hole 10.

The plurality of terminals 53 are provided inside the housing body 51 and correspond to the plurality of conductive lines 32 of the flat cable 30 in a one-to-one correspondence. Each of the plurality of terminals 53 may include a connection contact 54 which is in contact with the contact 32a of the flat cable 30 fixed to the cable connecting portion 51a of the housing 50 and a housing contact 55 which is exposed to the outside of the housing body 51. In other words, the plurality of housing contacts 55 are formed to be exposed to one side of the housing body 51, and are in one-to-one correspondence with the plurality of contacts 32a of the flat cable 30. Therefore, when the housing 50 provided at the one end of the flat cable 30 is inserted into the cable connection hole 10 of the electronic circuit board 1, the housing contacts 55 of the housing 50 are in contact with the internal contacts 20 of the cable connection hole 10 so that the plurality of contacts 32a of the flat cable 30 are electrically connected to the plurality of internal contacts 20 of the cable connection hole 10.

In addition, the connection contact 54 of the terminal 53 may be formed to make point contact with the conductive line 32 of the flat cable 30 at two points. The housing contact 55 of the terminal 53 may also be formed to make point contact with the internal contact 20 of the cable connection hole 10 at two points. In other words, the connection contacts 54 and the housing contacts 55 of the terminals 53 may be formed as a two-point contact.

As another example, the housing contacts 55 of the terminals 53 and the internal contacts 20 of the cable connection hole 10 may be formed to make surface contact with each other. At this time, the housing contacts 55 and the internal contacts 20 may be formed in various shapes to increase the contact area between the housing contact 55 and the internal contact 20.

FIGS. 15A to 15D are views illustrating various examples of an internal contact of an electronic circuit board and a housing contact of a housing which are in contact with each other.

Figure 15A:
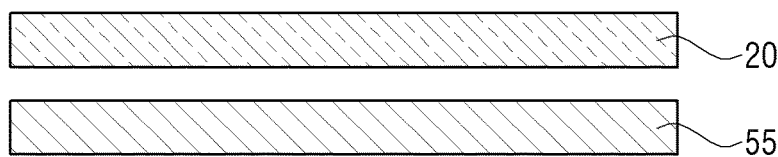
FIGS. 15A to 15D are views schematically illustrating various examples of an internal contact of an electronic circuit board and a housing contact of a housing of a flat cable which are in contact with each other.
Figure 15B:
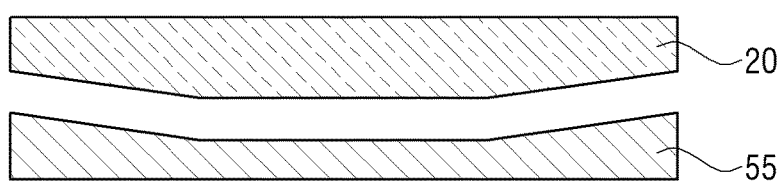

FIG. 15A illustrates a case where the contact surface of each of the housing contact 55 and the internal contact 20 is formed in a plane. FIG. 15B shows a case where the contact surface of the internal contact 20 is formed in an isosceles trapezoidal projection and the contact surface of the housing contact 55 is formed in an isosceles trapezoidal groove. When the contact surface is formed in this way, the area of the contact surface may be increased as compared with the case where the contact surface is planar as illustrated in FIG. 15A.

Figure 15C:
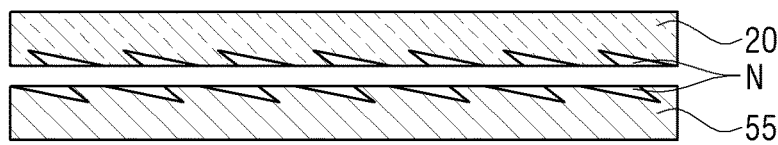
Figure 15D:
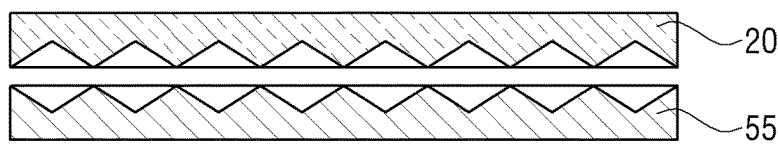

FIG. 15C shows a case where a plurality of triangular notches N are formed on the contact surfaces of the housing contact 55 and the internal contact 20 at regular intervals. FIG. 15D shows a case where the cross-section of the contact surface of each of the housing contact 55 and the internal contact 20 is formed in a triangular wave shape. When the contact surfaces of the housing contact 55 and the internal contact 20 are formed as illustrated in FIGS. 15C and 15D, the area of the contact surface may be increased as compared with the case where the contact surface is planar as illustrated in FIG. 15A.

Hereinafter, the structure of the housing contact of the housing will be described when there is no filling member in the internal contacts of the cable connection hole of the electronic circuit board.

Figure 16A:
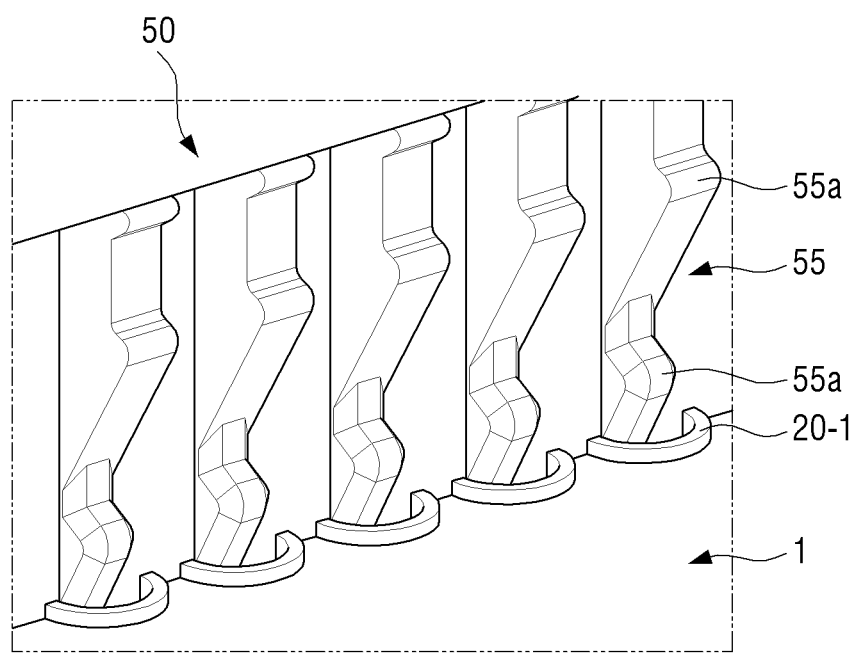
FIG. 16A is a partial perspective view illustrating another example of internal contacts of an electronic circuit board and housing contacts of a housing of a flat cable.
Figure 16B:
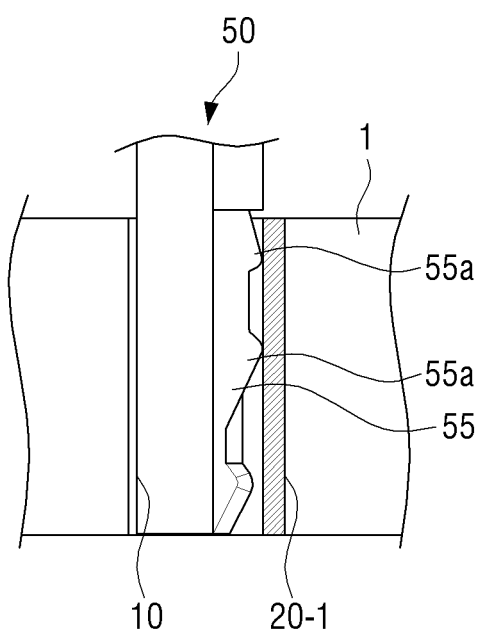
FIG. 16B is a partial cross-sectional view illustrating a state in which the internal contact of the electronic circuit board and the housing contact of FIG. 16A are engaged.

FIG. 16A is a partial perspective view illustrating another example of internal contacts of an electronic circuit board and housing contacts of a housing of a flat cable, and FIG. 16B is a partial cross-sectional view illustrating a state in which the internal contact of the electronic circuit board and the housing contact of FIG. 16A are engaged.

Referring to FIGS. 16A and 16B, the housing contact 55 of each of the plurality of terminals 53 of the housing 50 provided at one end of the flat cable 30 may be formed in an elastic piece having two contact points 55a.

Accordingly, when the insertion of the housing 50 of the flat cable 30 into the cable connection hole 10 of the electronic circuit board 1 is started, as illustrated in FIG. 16A, the leading ends of the elastic pieces 55 are located inside of the plurality of internal contacts 20-1 of the cable connection hole 10. Since each of the internal contacts 20-1 is formed in a curved surface having a substantially semicircular shape, the elastic pieces 55 are located inside the internal contacts 20-1. For example, as illustrated in FIG. 7, each of the internal contacts 20-1 may include a contact groove 21 which is formed on the inner surface 11 of the cable connection hole 10 and has a semicircular cross-section and a conductive layer 22 which is formed at a predetermined height on the inner surface of the contact groove 21 and has electrical conductivity.

In the state as illustrated in FIG. 16A, when a force is applied to the housing 50 in a downward direction, as illustrated in FIG. 16B, the two contact points 55a of the elastic piece 55 are in contact with the internal contact 20-1. Therefore, the plurality of conductive lines 32 of the flat cable 30 are electrically connected to the plurality of internal contacts 20-1 of the cable connection hole 10 through the two contact points 55a of each of the plurality of housing contacts 55 provided in the housing 50, respectively.

Figure 17:
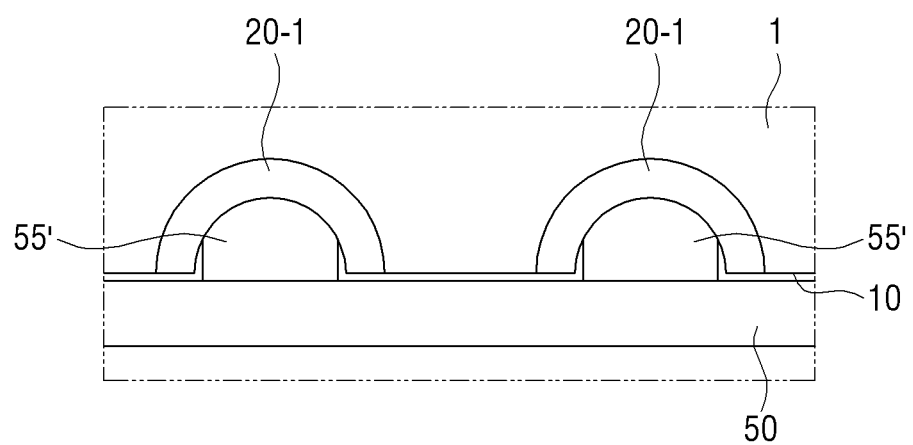
FIG. 17 is a partial cross-sectional view illustrating another example of internal contacts of an electronic circuit board and housing contacts of a housing of a flat cable.

FIG. 17 is a partial cross-sectional view illustrating another example of internal contacts of an electronic circuit board and housing contacts of a housing of a flat cable.

Referring to FIG. 17, each of the housing contacts 55' of the housing 50 provided at one end of the flat cable 30 may be formed in a protrusion having a curvature corresponding to the curvature of the internal contact 20-1 of the cable connection hole 10.

For example, as illustrated in FIG. 17, when the internal contact 20-1 of the cable connection hole 10 is formed in a curved surface of a substantially semicircular cross-section, the housing contact 55' which is inserted into the internal contact 20-1 may be formed in a protrusion having a curved cross-section corresponding to the semicircular cross-section of the internal contact 20-1, for example, a cross-section of a partial circle. Therefore, when the housing 50 provided at the flat cable 30 is inserted into the cable connection hole 10 of the electronic circuit board 1, the protruded housing contacts 55' of the housing 50 are inserted into the semicircular spaces of the internal contacts 20-1 of the cable connection hole 10 and come into contact with the internal contacts 20-1, respectively. Accordingly, the plurality of conductive lines 32 of the flat cable 30 are electrically connected to the plurality of internal contacts 20-1 of the cable connection hole 10 through the plurality of protruded housing contacts 55' provided in the housing 50, respectively.

With the connection structure between a flat cable and an electronic circuit board according to an exemplary embodiment of the present disclosure having the above-described structure, a connector is not provided on an electronic circuit board. However, a flat cable may be connected to the electronic circuit board by inserting one end of the flat cable into the cable connection hole which is formed in the electronic circuit board and includes a plurality of internal contacts. Therefore, the connection between the flat cable and the electronic circuit board may be very easy.

In addition, with the connection structure between a flat cable and an electronic circuit board according to an exemplary embodiment of the present disclosure, since the flat cable may be connected to the electronic circuit board by inserting the flat cable in the direction perpendicular to the electronic circuit board, it is easy to automate the connection of the flat cable. Accordingly, since the structure of an automatic equipment for automatically assembling the flat cable and the electronic circuit board is simplified, the manufacturing cost of the automatic equipment itself may be lowered.

Particularly, when a housing is provided at one end of the flat cable, it is easier to automate the assembly of the flat cable and the electronic circuit board.

While the embodiments of the present disclosure have been described, additional variations and modifications of the embodiments may occur to those skilled in the art once they learn of the basic inventive concepts. Therefore, it is intended that the appended claims shall be construed to include both the above embodiments and all such variations and modifications that fall within the spirit and scope of the inventive concepts.

What is claimed is:

1. A connection structure between a flat cable and an electronic circuit board, the connection structure comprising:
    an electronic circuit board;
    a cable connection hole formed to penetrate the electronic circuit board and in a substantially rectangular shape;
    a plurality of internal contacts provided on a side surface of an inner surface of the cable connection hole; and
    a flat cable provided with a plurality of contacts which correspond to the plurality of internal contacts of the cable connection hole and are exposed through a portion of one side surface of the flat cable,
    wherein an opposite portion of another side surface of the flat cable which is opposite to the portion of the one side surface through which the plurality of contacts are exposed is not opened, and
    wherein when one end of the flat cable is inserted into the cable connection hole of the electronic circuit board, the plurality of contacts of the flat cable are in contact with the plurality of internal contacts of the cable connection hole by the opposite portion of the flat cable, respectively.

2. The connection structure of claim 1, wherein each of the plurality of internal contacts comprises:
    a contact groove which is formed in the inner surface of the cable connection hole and includes a semicircular cross-section; and
    a conductive layer which is formed on an inner surface of the contact groove at a predetermined height and includes electrical conductivity.

3. The connection structure of claim 2, wherein each of the plurality of internal contacts further comprises a filling member which is filled on the conductive layer at a level equal to the inner surface of the cable connection hole and includes electrical conductivity.

4. The connection structure of claim 3, wherein each of the plurality of internal contacts further comprises a plating layer formed of an electrically conductive material on a surface of the filling member exposed to the inner surface of the cable connection hole.

5. The connection structure of claim 2, wherein contact grooves and conductive layers of the plurality of internal contacts are provided by forming a plurality of via holes in the electronic circuit board and forming the cable connection hole penetrating the electronic circuit board, wherein a plane passing through centers of the plurality of via holes is the inner surface of the cable connection hole.

6. The connection structure of claim 1, wherein the plurality of internal contacts are perpendicular to one surface of the electronic circuit board on which the cable connection hole is formed.

7. The connection structure of claim 1, wherein the plurality of internal contacts are inclined with respect to one surface of the electronic circuit board on which the cable connection hole is formed.

8. The connection structure of claim 1, wherein a circumference of an inlet of the cable connection hole into which the flat cable is inserted is chamfered.

9. The connection structure of claim 1, wherein the flat cable comprises:
a base portion;
a cover portion;
a plurality of conductive lines provided between the base portion and the cover portion;
a connection opening formed in the cover portion and spaced apart from one end of the cover portion, wherein a part of each of the plurality of conductive lines is exposed through the connection opening; and
a support portion provided on the base portion opposite to the cover portion at a position corresponding to the connection opening,
wherein the part of each of the plurality of conductive lines exposed through the connection opening forms each of the plurality of contacts.

10. The connection structure of claim 9, wherein a part of the support portion is separated from the base portion, and
wherein the flat cable further comprises a silicon tape attached to the part of the support portion separated from the base portion.

11. The connection structure of claim 9, wherein a thickness of the support portion is larger than a thickness of the base portion.

12. The connection structure of claim 9, wherein an edge of one end of the support portion corresponding to the one end of the flat cable is chamfered.

13. The connection structure of claim 9, wherein the one end of the flat cable is provided with a tapered insertion structure.

14. The connection structure of claim 13, wherein a pair of fixing grooves is provided adjacent to both sides of the connection opening of the flat cable.

* * * * *